United States Patent
Takeuchi et al.

(10) Patent No.: US 9,666,753 B2
(45) Date of Patent: May 30, 2017

(54) NITRIDE SEMICONDUCTOR LIGHT EMITTING DEVICE AND METHOD OF FABRICATING THE SAME

(71) Applicant: MEIJO UNIVERSITY, Nagoya-shi, Aichi (JP)

(72) Inventors: Tetsuya Takeuchi, Nagoya (JP); Daisuke Komori, Nagoya (JP); Kaku Takarabe, Nagoya (JP); Motoaki Iwaya, Nagoya (JP); Isamu Akasaki, Nagoya (JP)

(73) Assignee: MEIJO UNIVERSITY, Nagoya-Shi, Aichi (JP)

( * ) Notice: Subject to any disclaimer, the term of this patent is extended or adjusted under 35 U.S.C. 154(b) by 0 days.

(21) Appl. No.: 15/094,289

(22) Filed: Apr. 8, 2016

(65) Prior Publication Data
US 2016/0308094 A1    Oct. 20, 2016

(30) Foreign Application Priority Data
Apr. 17, 2015    (JP) ................ 2015-084802

(51) Int. Cl.
*H01L 33/00* (2010.01)
*H01L 33/32* (2010.01)
*H01L 33/12* (2010.01)

(52) U.S. Cl.
CPC .......... *H01L 33/007* (2013.01); *H01L 33/325* (2013.01); *H01L 33/12* (2013.01)

(58) Field of Classification Search
CPC ........................... H01L 33/145; H01L 33/007
See application file for complete search history.

(56) References Cited

U.S. PATENT DOCUMENTS

| | | | |
|---|---|---|---|
| 6,657,234 B1 | 12/2003 | Tanizawa | |
| 9,054,276 B2 * | 6/2015 | Jeon | ........................ H01L 33/38 |
| 2004/0051113 A1 * | 3/2004 | Chang | .................... B82Y 20/00 257/104 |
| 2004/0084667 A1 * | 5/2004 | Takahashi | .............. B82Y 20/00 257/11 |
| 2009/0085054 A1 * | 4/2009 | Jeon | ........................ H01L 33/06 257/101 |
| 2011/0073870 A1 * | 3/2011 | Jeon | ........................ H01L 33/06 257/76 |

FOREIGN PATENT DOCUMENTS

JP    2000-349337 A    12/2000

* cited by examiner

*Primary Examiner* — Calvin Choi
*Assistant Examiner* — S. M. S Imtiaz
(74) *Attorney, Agent, or Firm* — Smith, Gambrell & Russell, LLP

(57) ABSTRACT

A nitride semiconductor light emitting device includes a substrate as a base and an n-type semiconductor layer grown on a surface side of the substrate. Antimony (Sb) is added to the n-type semiconductor layer so that a molar fraction is not less than 0.1% and is less than 1%. A concentration of an n-type impurity in the n-type semiconductor layer is lower than an electron concentration.

20 Claims, 7 Drawing Sheets

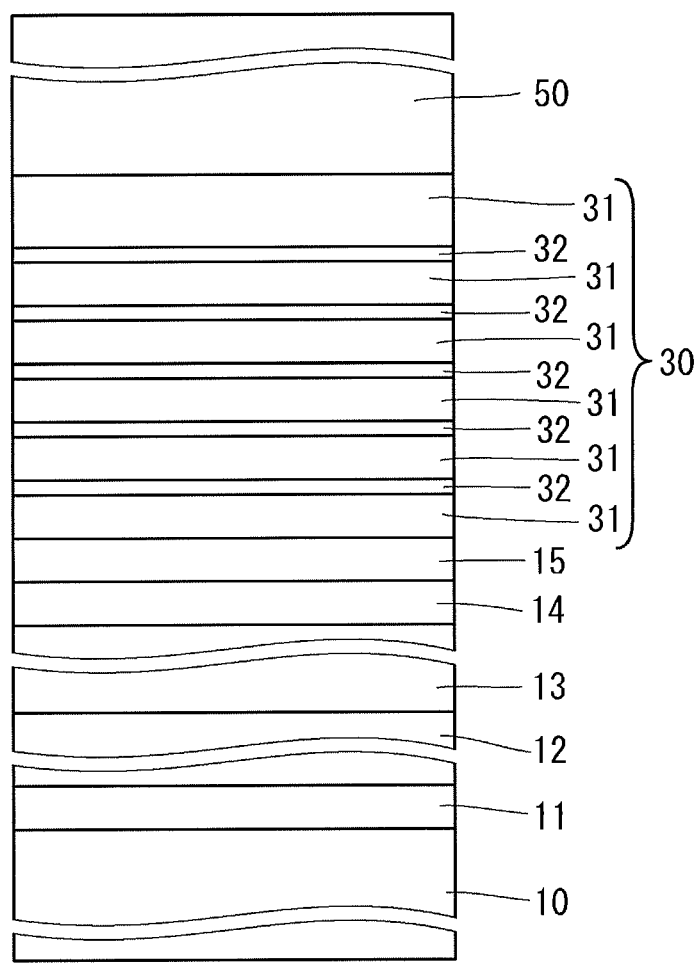

NITRIDE SEMICONDUCTOR LIGHT EMITTING DEVICE AND METHOD OF FABRICATING THE SAME

CROSS-REFERENCE TO RELATED APPLICATIONS

This application is based upon and claims the benefit of priority from the prior Japanese Patent Application No. 2015-084802 filed on Apr. 17, 2015, the entire contents of which are incorporated herein by reference.

BACKGROUND

1. Technical Field

The present invention relates to a nitride semiconductor light emitting device and a method of fabricating the same.

2. Related Art

Nitride semiconductor light emitting devices have conventionally been disclosed in which n-type semiconductor layers are grown while silicon (Si) serving as an n-type impurity is added thereto. In more detail, the n-type semiconductor layer in one of the conventional nitride semiconductor light emitting devices is formed by substituting Si for gallium (Ga) in the semiconductor layer such as gallium nitride (GaN) layer. Si is more easily controllable than elements of other n-type impurities when added to the n-type semiconductor layer. Accordingly, in the nitride semiconductor light emitting devices, an n-type semiconductor layer having desired characteristics can easily be fabricated by growing the n-type semiconductor layer while Si as an n-type impurity is added to the n-type semiconductor layer.

Thus, in the conventional nitride semiconductor light emitting device as described above, Si is substituted for Ga in GaN while Si is added to the n-type semiconductor layer. Si has a smaller atomic radius than Ga. Accordingly, when grown while a large amount of Si is added as the n-type impurity for the purpose of reduction in a device resistance, the n-type semiconductor layer causes tensile strain, resulting in occurrence of cracks. More specifically, since the above-described conventional semiconductor light emitting device is likely to cause cracks, there is a possibility that the device with good quality cannot be obtained.

SUMMARY

Therefore, an object of the invention is to provide a nitride semiconductor light emitting device of good quality and a method of fabricating the same.

According to one aspect of the invention, a nitride semiconductor light emitting device includes a substrate as a base and an n-type semiconductor layer grown on a surface side of the substrate. In the device, antimony (Sb) is added to the n-type semiconductor layer so that a molar fraction is not less than 0.1%. The n-type semiconductor layer has an electron concentration of not less than $1 \times 10^{18}$ cm$^{-3}$.

In the above-described device, the n-type semiconductor layer is grown while Sb is added to the n-type semiconductor layer. Sb is substituted for N in GaN, which N is the same group V element as Sb. Sb has a larger element radius than N. This can reduce occurrence of tensile strain in the n-type semiconductor layer when the n-type semiconductor layer is grown while Sb is added to the n-type semiconductor layer. Consequently, the n-type semiconductor layer can be grown with occurrence of cracks being suppressed.

In another aspect, a method of fabricating a nitride semiconductor light emitting device includes a first step of growing an active layer on a surface side of a substrate and a second step of growing an n-type semiconductor layer to which antimony (Sb) is added, on a surface side of the active layer under a condition that a temperature of the substrate is higher than 650° C. and lower than or equal to 850° C.

The temperature of the substrate in the case of growing an active layer is generally higher than the temperature of the substrate in the case of growing the n-type semiconductor layer. Accordingly, in the conventional method of fabricating the nitride semiconductor light emitting device, the substrate temperature is required to be higher than the substrate temperature in the case of growing the active layer when the n-type semiconductor layer is grown on the surface side of the active layer after the growth of the active layer. More specifically, the active layer has a possibility of being damaged by the substrate temperature in growing the n-type semiconductor layer in the conventional fabricating method.

On the other hand, in the method of fabricating the nitride semiconductor light emitting device according the present invention, the n-type semiconductor layer is grown while Sb is added to the n-type semiconductor layer. As a result, the n-type semiconductor layer can desirably be grown at the substrate temperature lower than that in the case of growing the conventional n-type semiconductor layer. Accordingly, when the n-type semiconductor layer is grown on the surface side of the active layer after the growth of the active layer in the fabricating method of the present invention, the substrate temperature in the case of growing the n-type semiconductor layer can be rendered substantially equal to the substrate temperature in the case of growing the active layer, with the result that thermal damage to the active layer can be reduced.

Accordingly, the present invention can provide the nitride semiconductor light emitting device of good quality.

In an embodiment, the antimony (Sb) added to the n-type semiconductor layer may have the molar fraction of less than 1%. In this case, the crystallinity of the n-type semiconductor layer to which Sb is added can be improved.

In another embodiment, the n-type semiconductor layer may be grown under a condition that a temperature of the substrate is higher than 650° C. and lower than or equal to 850° C. In this case, the electron concentration of the n-type semiconductor layer can be improved.

In further another embodiment, the n-type semiconductor layer may be grown in an atmosphere of a carrier gas mainly comprising molecular hydrogen ($H_2$). In this case, the crystallinity of the n-type semiconductor layer can be rendered better as compared with the case where the n-type semiconductor layer is grown in an atmosphere of another carrier gas mainly comprising molecular nitrogen ($N_2$) or the like. Furthermore, the surface flatness of the n-type semiconductor layer can be rendered more desirable.

In further another embodiment, the nitride semiconductor light emitting device may further include an active layer grown on the surface side of the substrate. The active layer may have a surface side on which the n-type semiconductor layer is grown. In this case, the n-type semiconductor layer is grown while Sb is added to the n-type semiconductor layer. As a result, the substrate temperature in the case of growing the n-type semiconductor layer can be rendered lower than the substrate temperature in the case of growing the conventional n-type semiconductor layer. Accordingly, thermal damage to the active layer can be reduced even when the active layer has the GaInN quantum well having a high molar fraction of InN capable of emitting long-wavelength light with an emission wavelength of 550 nm.

BRIEF DESCRIPTION OF THE DRAWINGS

FIG. 7 is a diagrammatic view showing layer structure of the nitride semiconductor light emitting device of a fourth embodiment.

DETAILED DESCRIPTION

Embodiments 1 to 4 and comparative examples 1 to 4 will now be described. Firstly, an AlN low-temperature buffer layer or a GaN low-temperature buffer layer (neither shown) is grown on a surface side of a sapphire substrate surface with a c-face serving as a surface. A GaN layer (not shown) having a thickness of 3 μm is grown on a surface side of the low-temperature buffer layer. An Sb material such as trimethylantimony (TMSb) is supplied into a reacting furnace so that a GaNSb layer (not shown) having a thickness ranging from 0.3 μm to 0.4 μm is grown on a surface side of the GaN layer. Molecular hydrogen $H_2$ is used as a carrier gas in this case. A semiconductor layer has a growth rate set to about 2 μm. Further, a supply ratio of a group V material to a group III material is set to about 1000, and a supply ratio of a Sb material to a group V material is set to about 0.4. Under these conditions, a temperature of the substrate in the case of growing the GaNSb layer is changed to five values, whereby samples of embodiments 1 to 3 and comparative examples of 1 and 2 are fabricated respectively. TABLE 1 shows the substrate temperatures in the case of growing the GaNSb layers of the samples.

TABLE 1

|  | Substrate temperature |
| --- | --- |
| Comparative example 1 | 980° C. |
| Embodiment 1 | 850° C. |
| Embodiment 2 | 800° C. |
| Embodiment 3 | 750° C. |
| Comparative example 2 | 650° C. |

Figure 1:
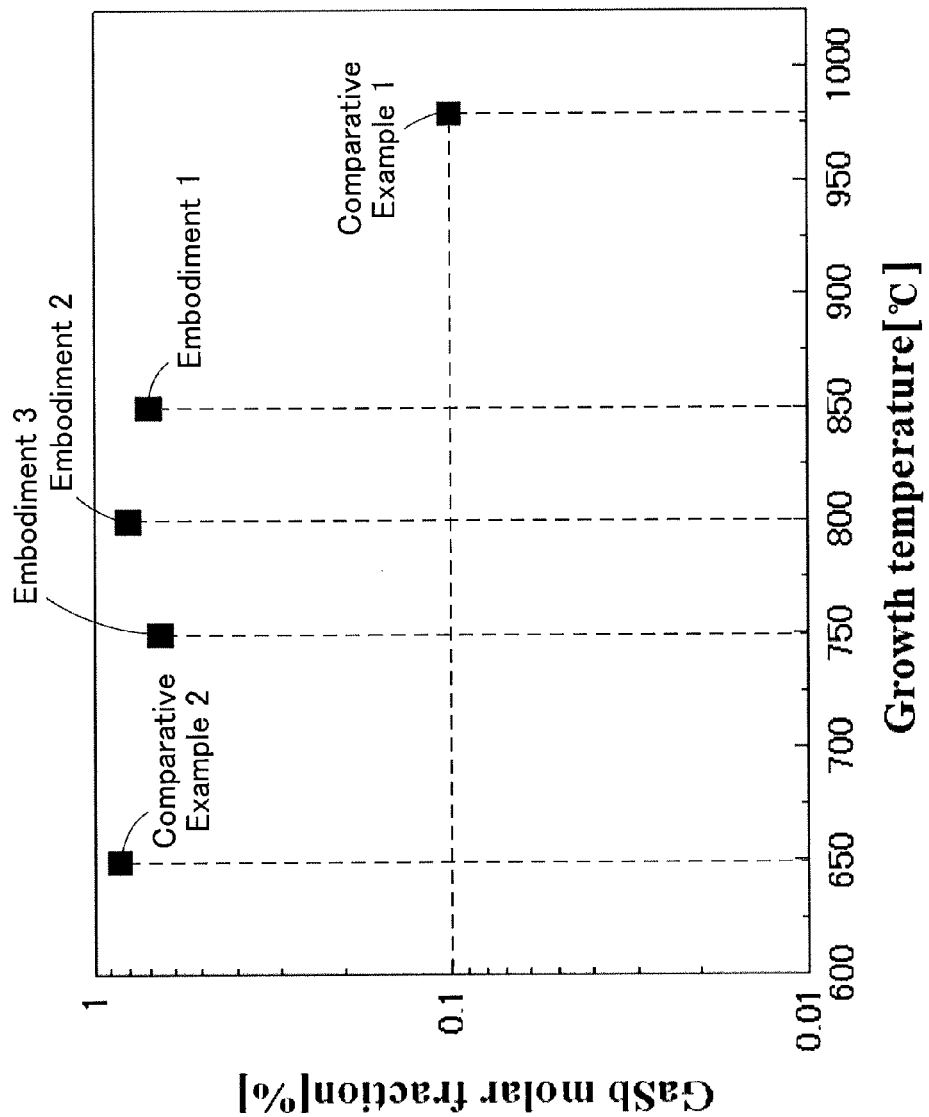
FIG. 1 is a graph showing GaSb molar fractions relative to substrate growth temperatures of embodiments 1 to 3 and comparative examples 1 and 2 respectively.

FIG. 1 shows molar fractions of GaSb to the substrate temperatures in the case of growing the GaNSb layers of embodiments 1 to 3 and comparative examples 1 and 2. The molar fractions are measured by a secondary ion mass spectrometry (SIMS). Comparative example 1 has a GaSb molar fraction of about 0.1%. Further, embodiments 1 to 3 and comparative example 2 have respective GaSb molar fractions of less than 1% and approximately 1%.

Figure 2:
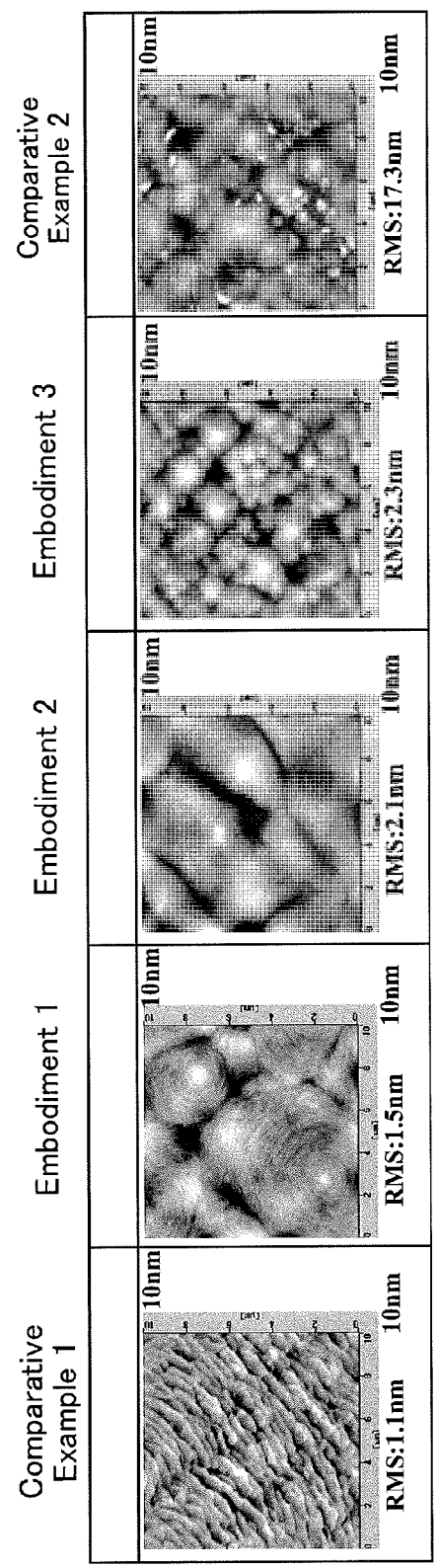
FIG. 2 shows photographical copies of surface atomic force microscope (AFM) images obtained in embodiments 1 to 3 and comparative examples 1 and 2.

FIG. 2 shows images of the surfaces of embodiments 1 to 3 and comparative examples 1 and 2 taken by an atomic force microscope (AFM). In embodiment 3, the temperature of the substrate is set to 750° C. in the case of growing the GaNSb layer on the surface. The substrate temperature in embodiment 3 is lower by 300° C. than a standard substrate temperature of 1050° C. in the case of growing a GaN layer. It is generally known that a desirable surface flatness can be obtained when a GaN layer is grown with the substrate temperature being set to not less than 1000° C. and that the surface flatness is reduced when the GaN layer is grown with the substrate temperature being set to be lower than 1000° C. However, an RMS (root mean square) value of the surface level difference in embodiment 3 is about 2 nm even though the substrate temperature is set to 750° C., with the result that the surface flatness is desirable. Further, an RMS value of the surface level difference is about 17 nm in comparative example 2 in which the substrate temperature in the case of growing the GaNSb layer is set to 650° C. Thus, it can be found that the surface flatness is undesirable in comparative example 2.

Figure 3:
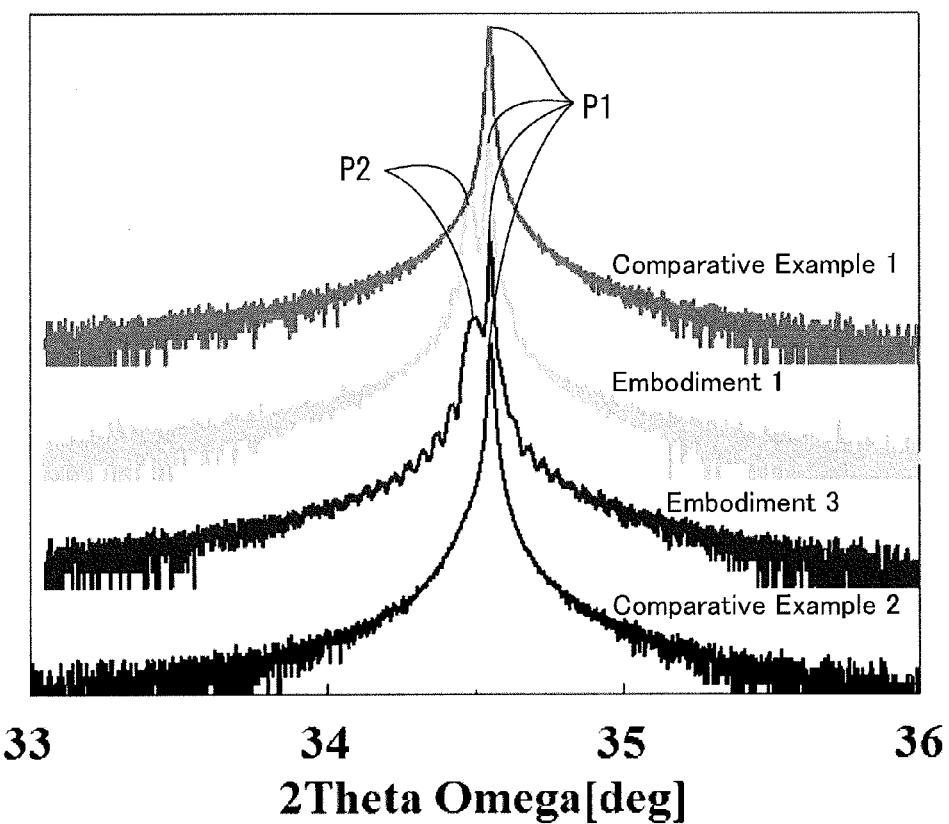
FIG. 3 is a graph showing results of X-ray diffraction measurement in embodiments 1 and 3 and comparative examples 1 and 2.

FIG. 3 shows results of X-ray diffraction measurement executed in embodiments 1 and 3 and comparative examples 1 and 2. Regarding comparative example 1, the GaSb molar fraction is about 0.1%, which value is lower than those of embodiments 1 to 3 and comparative example 2 (see FIG. 1). Accordingly, no diffraction peak of GaNSb separated from diffraction peak P1 of GaN is measured.

In each of embodiments 1 and 3, the GaSb molar fraction is about 1%, which value is higher than that of comparative example 1 (see FIG. 1). Accordingly, diffraction peak P2 originated from GaNSb clearly separated from diffraction peak P1 is measured in embodiments 1 and 3. In other words, it is found that each of embodiments 1 and 3 has a good crystallinity.

Comparative example 2 has GaSb molar fraction of about 1%, which value is substantially the same as those of the GaSb molar fractions of embodiments 1 and 3. However, no clear diffraction peak originated from GaNSb can be observed regarding comparative example 2. More specifically, comparative example 2 is considered not to have a good crystallinity.

Among the samples of embodiments 1 to 3 and comparative examples 1 and 2, hole measurement is carried out regarding embodiments 1 and 3 and comparative example 1 each one of which has a good surface flatness.

Since Sb belongs to group V to which nitrogen (N) also belongs, Sb is neither an n-type impurity supplying electrons nor a p-type impurity supplying positive holes. Accordingly, regarding embodiments 1 and 3 and comparative example 1, the results of hole measurement are expected to exhibit high resistance by addition of Sb or exhibit a low electron concentration of about $1\times10^{17}$ $cm^{-3}$ even when showing n-type conductivity.

Figure 4:
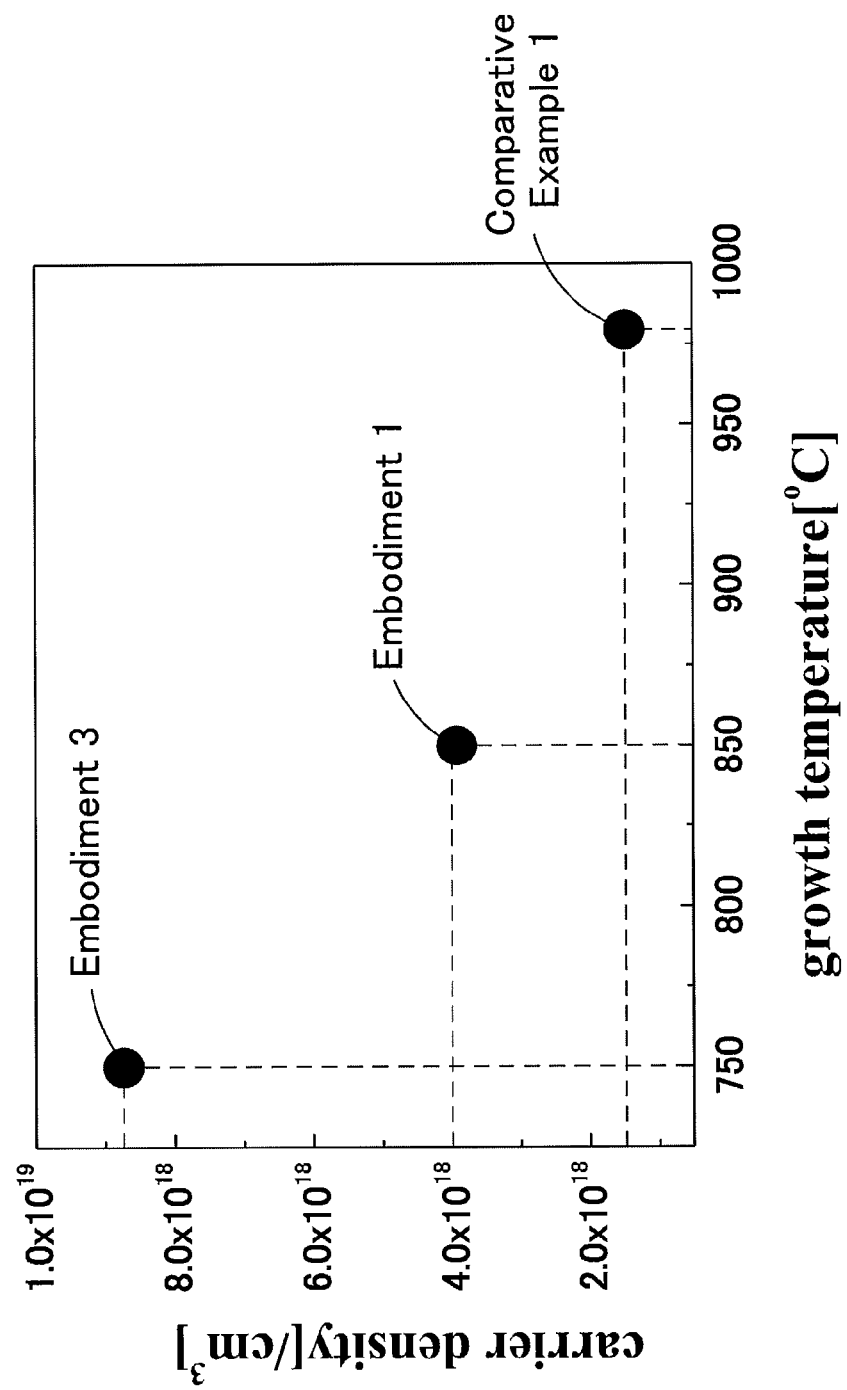
FIG. 4 is a graph showing the relationship between electron concentration and substrate growth temperature in embodiments 1 and 3 and comparative example 1.

As shown in FIG. 4, however, it is found that embodiments and 3 and comparative example 1 exhibit a clear n-type conductivity from the results of hole measurement. In more detail, embodiments 1 and 3 and comparative example 1 have high electron concentration of not less than $1\times10^{18}$ $cm^{-3}$ from the results of hole measurement. In particular, embodiments 1 and 3 have high electron concentration of not less than $4\times10^{18}$ $cm^{-3}$. Thus, it can be found that addition of Sb with the molar fraction of not less than 0.1% realizes the n-type semiconductor layer of the electron concentration of not less than $1\times10^{18}$ $cm^{-3}$ without the n-type impurity.

No Si serving as an n-type impurity is added to embodiments 1 to 3 and comparative examples 1 and 2. Further, no crack occurs in the substrates of embodiments 1 and 3 and comparative example 1. Accordingly, a great advantage can be achieved when a method of growing an n-type semiconductor layer with addition of Sb is applied to a device layer structure requiring current injection.

Use of $H_2$ as a carrier gas would cause etching of indium nitride (InN) when a GaInN layer is grown with addition of In to GaN. In view of this possibility, $N_2$ as the carrier gas is used in order to improve molar fraction of InN and suppress occurrence of etching of InN by $H_2$. This technique is applied to the growth of GaNSb layer.

More specifically, samples are made which have the same structure as embodiments 1 to 3 and comparative examples 1 and 2 respectively. In this case, molecular nitrogen $N_2$ is used as the carrier gas. In more detail, samples of comparative examples 3 and 4 are made by changing into two values the temperature of the substrate in the case of growing the GaNSb layer. TABLE 2 shows substrate temperatures in the case of growing the GaNSb layers of these samples.

TABLE 2

|  | Substrate temperature |
| --- | --- |
| Comparative example 3 | 800° C. |
| Comparative example 4 | 750° C. |

Figure 5:
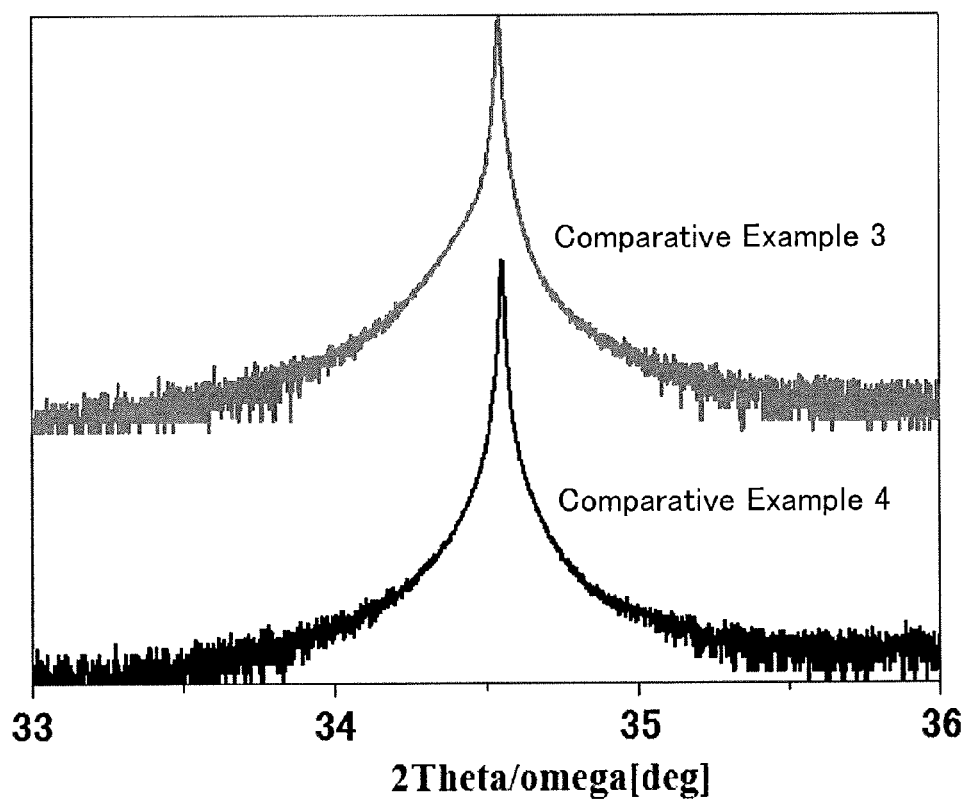
FIG. 5 is a graph showing results of X-ray diffraction measurement in comparative examples 3 and 4.
Figure 6:
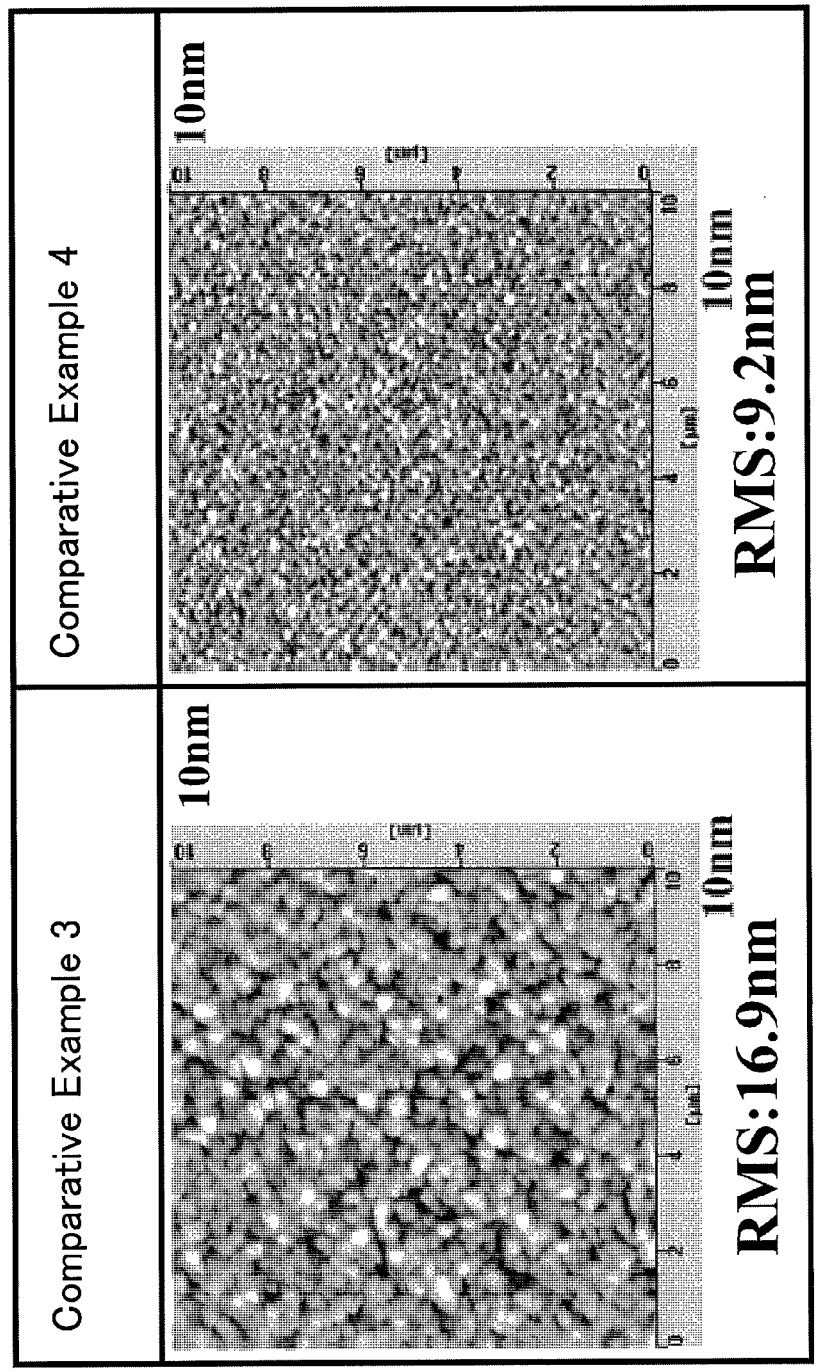
FIG. 6 shows surface AFM images in comparative examples 3 and 4.

From the results of SIMS measurement regarding comparative examples 3 and 4, it is found that a few percent of Sb is incorporated into the GaNSb layer under the condition where the substrate temperature ranges from about 750° C. to about 800° C. in the case of growing the GaNSb layer (not shown). Regarding comparative examples 3 and 4, however, no clear diffraction peaks originated from GaNSb are observed as shown in FIG. 5. Further, comparative examples 3 and 4 are found to have respective larger RMS values of surface level differences than embodiments 1 to 3 and comparative example 1, as shown in FIG. 6. As a result, comparative examples 3 and 4 are considered to have respective undesirable crystallinities. More specifically, it is found that a GaNSb layer having better crystallinity and better surface flatness can be fabricated when the GaNSb layer is grown in an atmosphere of a carrier gas mainly comprising $H_2$ than when the GaNSb layer is grown in an atmosphere of a carrier gas mainly comprising $N_2$.

Next, embodiment 4 will be described with reference to the drawings. Embodiment 4 is fabricated based on the findings obtained from the experiments executed using the samples of embodiments 1 to 3 and comparative examples 1 to 4.

A nitride semiconductor light emitting device of embodiment 4 includes a sapphire substrate 10, an active layer 30 and a GaNSb layer 50, as shown in FIG. 7. Firstly, the sapphire substrate 10 is set in a reacting furnace of a metalorganic chemical vapor deposition (MOCVD) apparatus with a c-face serving as a surface (an upper side as viewed in FIG. 7). The temperature of the substrate is increased to 1100° C. while $H_2$ serving as a carrier gas is supplied into the reacting furnace, whereby a thermal cleaning process is applied to the surface of the sapphire substrate 10.

Next, the atmospheric temperature in the reacting furnace is adjusted such that the temperature of the substrate is reduced to 500° C. When the substrate temperature becomes stable, ammonia ($NH_3$) and trimethylaluminum (TMAl) are supplied into the reacting furnace. As a result, an AlN low-temperature buffer layer 11 having a thickness of about 20 nm is grown on the surface of the sapphire substrate 10. Thereafter, supply of TMAl is temporarily stopped. In this case, a GaN low-temperature buffer layer may be grown instead of the AlN low-temperature buffer layer 11.

Next, while $NH_3$ and $H_2$ are supplied into the reacting furnace, the atmospheric temperature in the reacting furnace is adjusted such that the temperature of the substrate is increased to 1050° C. When the substrate temperature becomes stable, trimethylgallium (TMGa) is supplied into the reacting furnace. As a result, a GaN layer 12 having a thickness of about 3 μm is grown on the surface of the AlN low-temperature buffer layer 11. When the GaN layer 12 has been grown, bis (cyclopentadienyl) magnesium ($Cp_2Mg$) serving as a p-type impurity material gas is supplied into the reacting furnace. As a result, a p-type GaN layer 13 having a thickness of about 2 μm is grown on a surface of the GaN layer 12. In this case, an amount of $Cp_2Mg$ supplied into the reacting furnace is adjusted such that a concentration of Mg serving as a p-type impurity added to the p-type GaN layer 13 becomes $2 \times 10^{19}$ cm$^{-3}$.

Next, trimethylaluminum (TMAl) is supplied into the reacting furnace in order that a p-type AlGaN layer 14 having a thickness of about 20 nm may be grown on a surface of the p-type GaN layer 13. In this case, an amount of $Cp_2Mg$ supplied into the reacting furnace is adjusted such that a concentration of Mg added to the p-type AlGaN layer 14 becomes $2 \times 10^{19}$ cm$^{-3}$. When the p-type AlGaN layer 14 has been grown, supply of TMAl and $Cp_2Mg$ into the reacting furnace is stopped. Thus, a nondoped GaN layer 15 having a thickness of about 20 nm is grown on a surface of the p-type AlGaN layer 14. Supply of TMGa is then stopped with the result that layer growth is interrupted.

Next, the atmospheric temperature in the reacting furnace is adjusted such that the temperature of the substrate is reduced to 700° C. The carrier gas is changed from $H_2$ to $N_2$ while $NH_3$ is supplied into the reacting furnace. When the substrate temperature and flow rates of the gases have become stable, triethylgallium (TEGa) is supplied into the reacting furnace. Thus, a GaN barrier layer 31 having a thickness of about 10 nm is grown on a surface of the nondoped GaN layer 15.

Next, trimethylindium (TMIn) is supplied into the reacting furnace in order that a GaInN quantum well layer 32 having a thickness of 2 nm may be grown on a surface of the GaN barrier layer 31. Supply of TMIn into the reacting furnace is temporarily stopped. Five pairs of the GaN barrier layers 31 and the GaInN quantum well layers 32 are stacked one upon another. The GaN barrier layer 31 having a thickness of about 30 nm is grown on a surface of the fifth GaInN quantum well layer 32, so that the GaInN quintuple quantum well active layer 30 serving as an active layer is grown, as shown in FIG. 7. Thus, a first process is ended in which the GaInN quintuple quantum well active layer 30 is grown on the surface side of the sapphire substrate 10 serving as the base. The GaInN quintuple quantum well active layer 30 has an emission wavelength of 550 nm.

When the growth of GaInN quintuple quantum well active layer 30 (the first process) has been ended, the growth of the layer is interrupted. The carrier gas is changed from $N_2$ to $H_2$ while $NH_3$ is supplied into the reacting furnace. The atmospheric temperature in the reacting furnace is adjusted such that the temperature of the substrate is increased to 750° C. When the substrate temperature becomes stable, TMGa and trimethylantimony (TMSb) are supplied into the reacting furnace. Thus, a GaNSb layer 50 having a thickness of about 0.1 μm is grown on the surface side of the GaInN quintuple quantum well active layer 30. In this case, a supply ratio of Sb material to group V material is set to 0.4. This grows the GaNSb layer 50 into an n-type semiconductor layer with an electron concentration of about $1 \times 10^{19}$ cm$^{-3}$ without addition of an n-type impurity such as Si, with the result that current can be injected into the GaInN quintuple quantum well active layer 30. Thus, a second process is ended which grows the GaNSb layer 50 serving as the n-type semiconductor layer fabricated by adding Sb to the surface of the GaInN quintuple quantum well active layer 30 serving as the active layer while the temperature of the substrate is set to 750° C. (higher than 650° C. and lower than or equal to 850° C.).

The nitride semiconductor light emitting device thus fabricated includes the sapphire substrate 10 serving as the base and the GaNSb layer 50 which is formed on the surface side of the sapphire substrate 10 and serves as the n-type semiconductor layer. Antimony (Sb) is added to the GaNSb layer 50 and has the molar fraction of not less than 0.1% and the electron concentration of not less than $1 \times 10^{18}$ cm$^{-3}$.

Thus, in fabricating the nitride semiconductor light emitting device, the GaNSb layer 50 serving as the n-type semiconductor layer is grown while Sb is added thereto. Accordingly, occurrence of tensile strain can be reduced in the GaNSb layer 50 of the nitride semiconductor light emitting device. As a result, the GaNSb layer 50 can be grown while occurrence of crack is reduced.

Further, in the method of fabricating the nitride semiconductor light emitting device, when the GaNSb layer 50 is grown on the surface of the GaInN quintuple quantum well active layer 30 after growth of the GaInN quintuple quantum well active layer 30, the temperature (750° C.) of the substrate in the case of growing the GaNSb layer 50 can be rendered substantially equal to the temperature (700° C.) of the substrate in the case of growing the GaInN quintuple quantum well active layer 30. As a result, thermal damage to the GaInN quintuple quantum well active layer 30 can be reduced.

Accordingly, the nitride semiconductor light emitting device and the method of fabricating the nitride semiconductor light emitting device in accordance with the present invention can improve the quality of the nitride semiconductor light emitting device.

Furthermore, the molar fraction of Sb added to the GaNSb layer 50 serving as the n-type semiconductor layer is less than 1%. Accordingly, the crystallinity of the GaNSb layer 50 to which Sb is added can be improved.

Furthermore, the GaNSb layer 50 is grown while the temperature of the substrate is maintained at 750° C. (higher than 650° C. and lower than or equal to 850° C.). Accordingly, the electron concentration of the GaNSb layer 50 can be improved in the nitride semiconductor light emitting device.

Furthermore, the GaNSb layer 50 is grown in the atmosphere of the carrier gas mainly comprising $H_2$. Accordingly, the crystallinity of the GaNSb layer 50 can be rendered better as compared with the case where the GaNSb layer 50 is grown in an atmosphere of another carrier gas mainly comprising $N_2$ or the like. The surface flatness of the GaNSb layer 50 can also be improved.

Furthermore, the nitride semiconductor light emitting device includes the GaInN quintuple quantum well active layer 30 which is an active layer grown on the surface side of the sapphire substrate 10, and the GaNSb layer 50 is grown on the surface side of the GaInN quintuple quantum well active layer 30. Accordingly, in the nitride semiconductor light emitting device, the GaNSb layer 50 is grown while Sb is added thereto, whereby the substrate temperature at which the GaNSb layer 50 is grown can be lowered as compared with substrate temperatures at which the conventional n-type semiconductor layers are grown. Accordingly, thermal damage to the active layer can be reduced even when the active layer has the GaInN quantum well having a high molar fraction of InN capable of emitting long-wavelength light with an emission wavelength of 550 nm.

The invention should not be limited to embodiments 1 to 4 described above with reference to the drawings but the technical scope of the invention encompasses the following embodiments, for example.

(1) Si serving as the n-type impurity is not added to the n-type semiconductor layer in each of embodiments 1 to 4. However, silane (SiH$_4$) serving as an n-type impurity material gas may be supplied into the reacting furnace, as necessary, so that the n-type semiconductor layer may be grown with Si as the n-type impurity being added together with addition of Sb. In this case, an n-type semiconductor layer with a high electron concentration can be grown by addition of a small amount of Si. This can reduce tensile strain caused by growing the n-type semiconductor layer with Si being added and deterioration of crystallinity such as roughness of the substrate surface, with the result that low resistance devices can be grown with an improved yield.

(2) Although the n-type semiconductor layer is grown on the surface of the active layer in embodiment 4, a layer with a specific function may be provided between the active layer and the n-type semiconductor layer (for example, a layer which can effectively trap carriers such as an n-type AlGaN layer having a thickness of 20 nm). This can achieve the same advantageous effect as the n-type semiconductor layer of embodiment 4. Further, use of an AlGaNSb layer grown while Al is added to the n-type semiconductor layer together with Sb can achieve the same advantageous effect as the n-type semiconductor layer of embodiment 4.

(3) Although Mg is used as the p-type impurity in embodiment 4, zinc (Zn), beryllium (Be), calcium (Ca), strontium (Sr), barium (Ba) or the like, all of which are p-type impurities, may be employed.

(4) Although the semiconductor layer is formed on the c-face as a surface of the sapphire crystal in embodiment 4, a semiconductor layer may be formed on a semi-polar face as a surface, instead.

(5) Although the active layer is formed by stacking five pairs of single-layer quantum well layers and single-layer barrier layers, the number of pairs may be reduced or increased, instead.

(6) Although the light emitting wavelength of the active layer is set to 550 nm in embodiment 4, the light emitting wavelength may be longer or shorter than 550 nm, instead.

(7) Although a single active layer is provided in embodiment 4, a plurality of active layers may be provided between intermediate layers, instead.

(8) Although the sapphire substrate is used in each of embodiments 1 to 4, another base plate such as a GaN substrate, an AlN substrate or the like may be used, instead.

(9) Although the layer is grown by the MOCVD apparatus in embodiment 4, another apparatus such as a hydride vapor phase epitaxy (HYPE) apparatus may be used to grow the layer, instead.

What is claimed is:

1. A nitride semiconductor light emitting device comprising:
   a substrate as a base; and
   an n-type semiconductor layer grown on a surface side of the substrate, wherein antimony (Sb) is added to the n-type semiconductor layer so that a molar fraction is not less than 0.1% and is less than 1%; and wherein a concentration of an n-type impurity in the n-type semiconductor layer is lower than an electron concentration in the n-type semiconductor layer.

2. The device according to claim 1, wherein the n-type semiconductor layer is grown under a condition that a temperature of the substrate is higher than 650° C. and equal to or lower than 850° C.

3. The device according to claim 1, wherein the n-type semiconductor layer is grown in an atmosphere of a carrier gas mainly comprising molecular hydrogen ($H_2$).

4. The device according to claim 1, further comprising an active layer grown on the surface side of the substrate,
wherein the active layer has a surface side on which the n-type semiconductor layer is grown.

5. A method of fabricating a nitride semiconductor light emitting device, comprising:
a first step of growing an active layer on a surface side of a substrate; and
a second step of growing an n-type semiconductor layer on a surface side of the active layer under a condition that a temperature of the substrate is higher than 650° C. and lower than or equal to 850° C., wherein antimony (Sb) is added to a surface side of the n-type semiconductor layer, and a concentration of an n-type impurity is lower than an electron concentration in the n-type semiconductor layer.

6. The device according to claim 2, wherein the n-type semiconductor layer is grown in an atmosphere of a carrier gas mainly comprising molecular hydrogen ($H_2$).

7. The device according to claim 6, further comprising an active layer grown on the surface side of the substrate, wherein the active layer has a surface side on which the n-type semiconductor layer is grown.

8. The device according to claim 1, wherein the substrate is a sapphire substrate.

9. The device according to claim 1, wherein the electron concentration ranges from $1\times10^{18}$ $cm^{-3}$ to $8.5\times10^{18}$ $cm^{-3}$.

10. The device according to claim 1, wherein the n-type impurity is not added to the n-type semiconductor layer.

11. The device according to claim 1, wherein the n-type impurity is silicon (Si).

12. The device according to claim 9, wherein the n-type impurity is not added to the n-type semiconductor layer.

13. The device according to claim 12, wherein the n-type impurity is silicon (Si).

14. The method according to claim 5, wherein the substrate is a sapphire substrate.

15. The method according to claim 5, wherein the n-type impurity is not added to the n-type semiconductor layer.

16. The method according to claim 5, wherein the n-type impurity is silicon (Si).

17. The method according to claim 15, wherein the n-type impurity is silicon (Si).

18. The method according to claim 5, wherein the n-type semiconductor layer is grown in an atmosphere comprising hydrogen.

19. The method according to claim 5, wherein the n-type semiconductor layer is grown in an atmosphere where a carrier gas is comprised mainly of molecular hydrogen.

20. The method according to claim 5, wherein the active layer is grown in a carrier gas atmosphere of nitrogen and the n-type semiconductor layer is grown in a carrier gas atmosphere of hydrogen.

\* \* \* \* \*